(12) United States Patent
Anilkumar et al.

(10) Patent No.: US 8,067,947 B2
(45) Date of Patent: Nov. 29, 2011

(54) LOW NOISE DIFFERENTIAL CHARGE AMPLIFIER FOR MEASURING DISCRETE CHARGES IN NOISY AND CORROSIVE ENVIRONMENTS

(75) Inventors: Ramsesh Anilkumar, Morristown, NJ (US); Baburaj Kaimalilputhenpura Prabhakaran, Morristown, NJ (US)

(73) Assignee: Honeywell International Inc., Morristown, NJ (US)

( * ) Notice: Subject to any disclaimer, the term of this patent is extended or adjusted under 35 U.S.C. 154(b) by 990 days.

(21) Appl. No.: 11/983,262

(22) Filed: Nov. 8, 2007

(65) Prior Publication Data

US 2009/0122885 A1 May 14, 2009

(51) Int. Cl.
*G01R 29/26* (2006.01)
*G01R 27/28* (2006.01)

(52) U.S. Cl. ......................... 324/613; 324/612

(58) Field of Classification Search ......................... None
See application file for complete search history.

(56) References Cited

U.S. PATENT DOCUMENTS

| | | | |
|---|---|---|---|
| 3,585,615 A * | 6/1971 | Takahashi et al. ............ 365/139 |
| 3,619,655 A * | 11/1971 | Cunningham ............ 330/124 D |
| 3,670,058 A | 6/1972 | Burney ............................ 264/22 |
| 4,043,008 A | 8/1977 | Weiss et al. ...................... 28/271 |
| 4,399,370 A | 8/1983 | Bulleyment ................... 307/112 |
| 4,540,382 A | 9/1985 | Wilson ............................ 464/73 |
| 4,608,636 A * | 8/1986 | Beals ................................ 702/6 |
| 5,214,243 A | 5/1993 | Johnson .......................... 174/36 |
| 5,302,905 A * | 4/1994 | Crick ............................ 324/613 |
| 5,338,897 A | 8/1994 | Tsay et al. ................... 174/35 R |
| 5,663,986 A | 9/1997 | Striffler ......................... 375/260 |
| 6,195,540 B1 | 2/2001 | Ogino et al. ................... 455/344 |
| 7,105,739 B2 | 9/2006 | Abe ................................ 174/28 |
| 2004/0071053 A1 * | 4/2004 | Yamamuro ................ 369/44.29 |

* cited by examiner

*Primary Examiner* — Vinh Nguyen
(74) *Attorney, Agent, or Firm* — Shumaker & Sieffert, P.A.

(57) ABSTRACT

A low noise differential charge amplifier circuit for measuring discrete (e.g., pico coulomb) charges in noisy, elevated temperature and corrosive environments. An input stage of a differential charge amplifier circuit includes a twisted and or untwisted two pair cable with a grounded shield. One twisted and or untwisted pair can be connected to a sensor and a first charge amplifier and a second twisted and or/untwisted pair can be connected to a sensor electrical equivalent impedance circuit and or kept open and a second charge amplifier. The output from the charge amplifiers can be directed to a differential amplifier in order to provide an amplified sensor signal without external noise signal mainly from power supply mains. The differential amplifier and the charge amplifiers can include an auto offset correction circuit to reduce errors due to offsets.

23 Claims, 6 Drawing Sheets

LOW NOISE DIFFERENTIAL CHARGE AMPLIFIER FOR MEASURING DISCRETE CHARGES IN NOISY AND CORROSIVE ENVIRONMENTS

TECHNICAL FIELD

Embodiments are generally related to noise reduction methods and systems. Embodiments are also related to differential low noise auto offset correcting charge amplifiers for measuring discrete variations in noisy, elevated-temperature and corrosive environments. Embodiments are additionally related to techniques for measuring less than or equal to pico coulomb charges.

BACKGROUND OF THE INVENTION

Signal conditioning circuits are often utilized as an interface in a signal conditioning unit to convert a differential input signal received from a data source into a more usable output signal. Signal conditioning circuits can be utilized in conjunction with sensors or transducers to receive a sensor or transducer output signal and convert this signal into an output voltage or current or frequency or pulse width or pulse position in analog or digital form utilized by a control system. For example, in order to maintain the quality of air, it is desirable to control internal combustion engine emissions. It is therefore necessary to provide long cable connections between the sensors and the signal conditioning circuits, which as a result, suffers from a poor signal to noise ratio due to the "pick up" of electrical interference and noise in the connecting cable. The degree of such interference is a function of the length of the connecting cable, sensitivity of the sensor and the general character of the electrical load.

Generally in the sensors the signal conditioning is a front end analog electronics which is very critical and difficult to design as it has to have high sensitivity, good selectivity, and immunity to noise, low cost, reproducible and mass producible. Such signal conditioning circuits include a voltage amplifier or a charge amplifier or a current amplifier (electrometer). For example, exhaust sensors utilized for sensing particulate matter the measured charge can be in the order of less than or equal to a pico coulombs. The signal to noise ratio will be very poor and the most of the noise will be due to common mode noise pick up from power line and other sources.

In a majority of prior art signal-conditioning circuits the signal from the sensor can be processed with noise and in the signal conditioning unit the noise can be eliminated selectively. But this results in a saturation condition at signal condition stage if the noise level is sufficiently large. Also if the signal and noise frequencies are the same then selectively eliminating the noise becomes a great challenge, difficult and expensive. Similarly, the noise at the input of the signal-conditioning amplifier can also be eliminated which has to be implemented in the analog amplifier design. The charge amplifiers utilized in sensing less than or equal to a pico coulomb charges in the exhaust gas and/or in the engine cylinder can be embedded in the common mode noise. Common mode noise is a disturbance that affects a plurality of lines similarly (e.g., causing a change of voltage of similar polarity and amplitude on each of the lines).

Common mode noise may be induced upon differential lines by another line that is parasitically coupled to the differential lines. The lines may be conductors, for example conductors formed in a metal layer of an integrated circuit or wires. The lines can carry signals. The signals carried by the line that is parasitically coupled to the differential lines may affect the signals carried by the differential lines through the effect of the parasitic coupling. The biggest source of common-mode noise is the difference in potential between two physically remote grounds. The second most significant common-mode noise source is ungrounded sources. Common-mode rejection techniques can be implemented to prevent common-mode noise from being converted to normal-mode voltage.

FIG. 1 illustrates a block diagram representation 100 of a prior art co-axial cable 190 utilized for connecting sensor element 140 and differential amplifier (charge or voltage or current) 170. The signal from the sensor 140 can be connected to the differential amplifier 170 through the co-axial cable 190. The co-axial cable 190 includes an inner cable 120 and an outer shield 110. The differential amplifier 170 can receive an output signal 150 and 160 from the inner cable 120 and the outer shield 110. The differential amplifier 170 delivers an output signal 180, which is proportional to the difference between the voltages on its input 150 and 160. The signal induced due to external interference in the inner cable 120 is almost zero and the signal induced due to the external interference on the outer shield 110 is maximum because the outer shield 110 functions to shield the inner cable 120. As depicted in FIG. 1, a 50 Hz noise signal 130 can be picked up by the outer shield 110 and will be maximum, which results in an increase in noise level at the output 180 of the differential amplifier 170.

FIG. 2 illustrates a block diagram representation 200 of a prior art untwisted pair of cable 290 utilized for connecting the sensor element 140 and differential charge amplifier 170. Note that in FIGS. 1-3, identical or similar parts or elements are generally indicated by identical reference numerals. The differential auto zero offset charge amplifier 170 can receive an output signal 240 from a first wire 220 and another output signal 230 from a second wire 210 of the untwisted pair cable 290. The 50 Hz/mains power supply frequency or external noise signal 130 picked up by the untwisted/twisted pair cable 290 will be equal; hence an output 250 of the differential charge amplifier 170 to 50 Hz picked up noise signal 130 will be a minimum. A shielded, twisted pair can be utilized in a channel to connect a signal from a source to an input terminal. The shields minimize capacitive coupling and the twisted wires minimize inductive coupling.

FIG. 3 illustrates a block diagram representation 300 of a prior art untwisted/twisted pair of cable 390 with grounded shield 320 utilized for connecting sensor element 140 and differential amplifier 170. The shield 320 of the untwisted/twisted cable 390 can be grounded. The differential charge amplifier 170 can receive an output signal 340 and 350 from the untwisted/twisted pair of cable 390. The output 360 of the differential charge amplifier 170 is immune to 50 Hz/mains power supply frequency or external noise signal 130 will be minimum as charge induced in the cable 390 will be minimum and equal. The twisted or untwisted grounded shield cable 390 can be utilized to reduce the common mode noise signal.

Based on the foregoing it is believed that a need exists for an improved low noise differential charge amplifier utilizing twisted or untwisted two pair cable with grounded shield for measuring less than or equal to pico coulomb charge in noisy elevated temperature and corrosive environment.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for improved noise reduction technique.

It is another aspect of the present invention to provide for improved connecting cable to reduce common mode external radiated noise signal mainly due to power supply lines.

It is further aspect of the present invention to provide for an improved method and system for measuring less than or equal to a pico coulomb charge in noisy and corrosive environment.

The aforementioned aspects and other objectives and advantages can now be achieved as described herein. A low noise differential charge amplifier circuit for measuring less than or equal to a pico coulomb charge in noisy, elevated temperature and corrosive environments is disclosed. The input stage of the differential charge amplifier circuit includes a twisted/untwisted two pair cable with grounded shield. One twisted pair can be connected to a sensor and a first charge amplifier and the second twisted pair can be connected to a sensor electrical equivalent impedance circuit or can be left open and a second charge amplifier. The output from the charge amplifiers can be directed to a differential amplifier in order to provide an amplified sensor signal without noise signal. The differential amplifier and the charge amplifiers include an auto offset correction circuit to reduce error due to offsets, mainly offset voltage and bias current.

The first charge amplifier/voltage amplifier/current amplifier amplifies the sensor signal and noise signal and the second charge amplifier/voltage amplifier/current amplifier amplifies the noise signal picked up by the cable. The differential amplifier subtracts the signals from the above mentioned amplifiers and the output can be an amplified sensor signal. The first and second pair of twisted/untwisted cable is shielded and can be placed in a single cable. The common mode signal picked up by the cable having same magnitude and same phase will get subtracted at the differential amplifier stage. The improved method disclosed herein can be utilized to reduce the common mode noise signal picked up by the twisted pairs of shielded cable.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
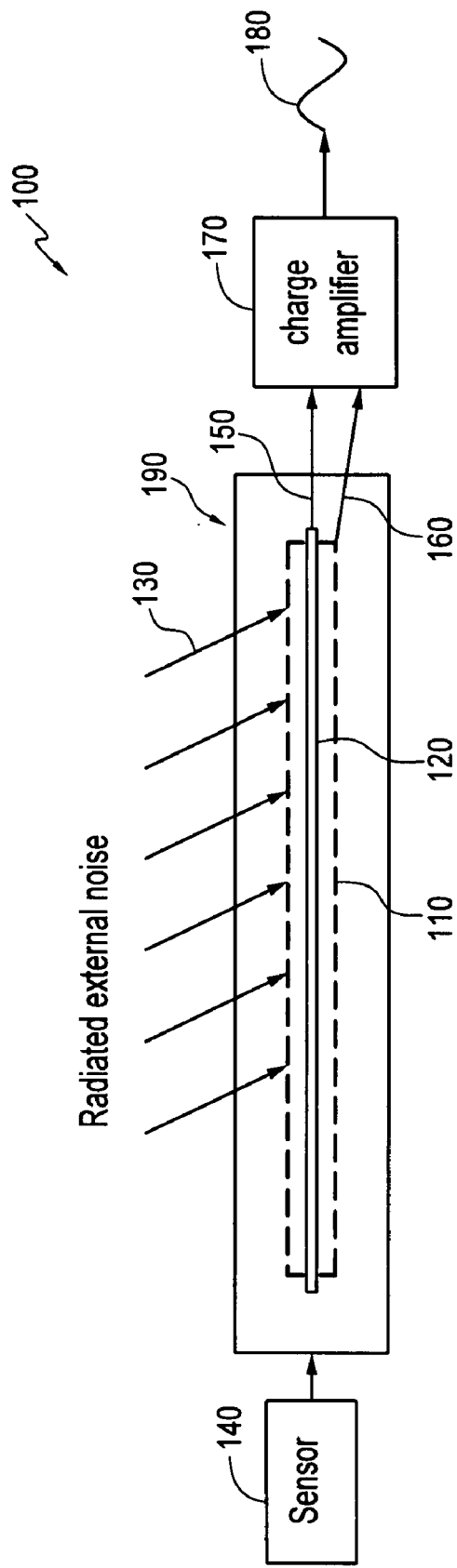
FIG. 1 illustrates a block diagram representation of a prior art co-axial cable utilized for connecting a sensor element and a charge amplifier.
Figure 2:
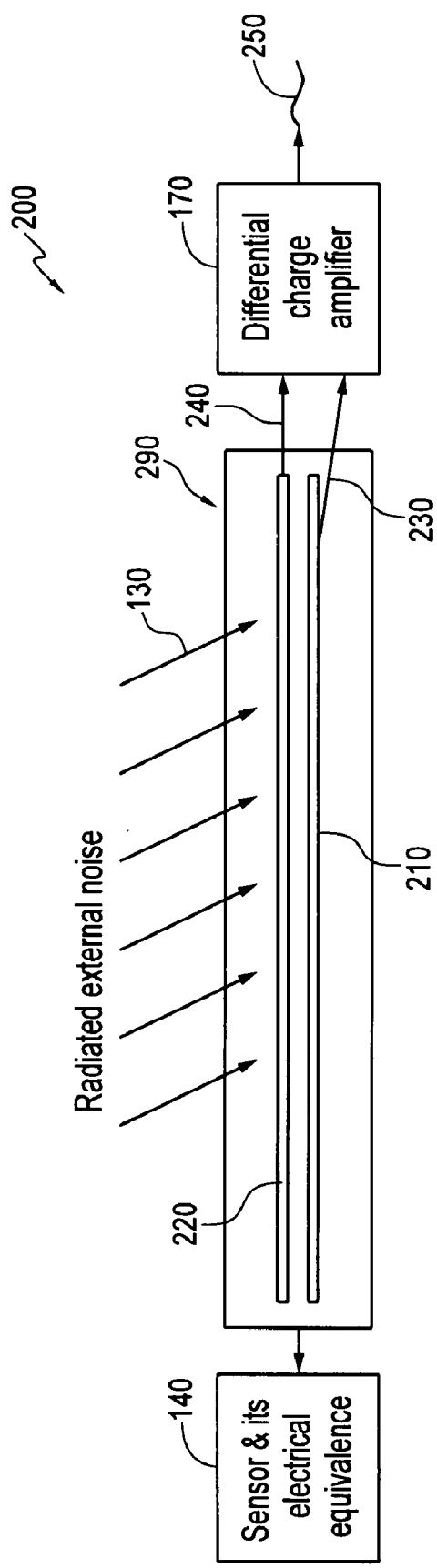
FIG. 2 illustrates a block diagram representation of a prior art untwisted/twisted pair of cable utilized for connecting the sensor element and its equivalent electrical circuit to the differential charge amplifier.
Figure 3:
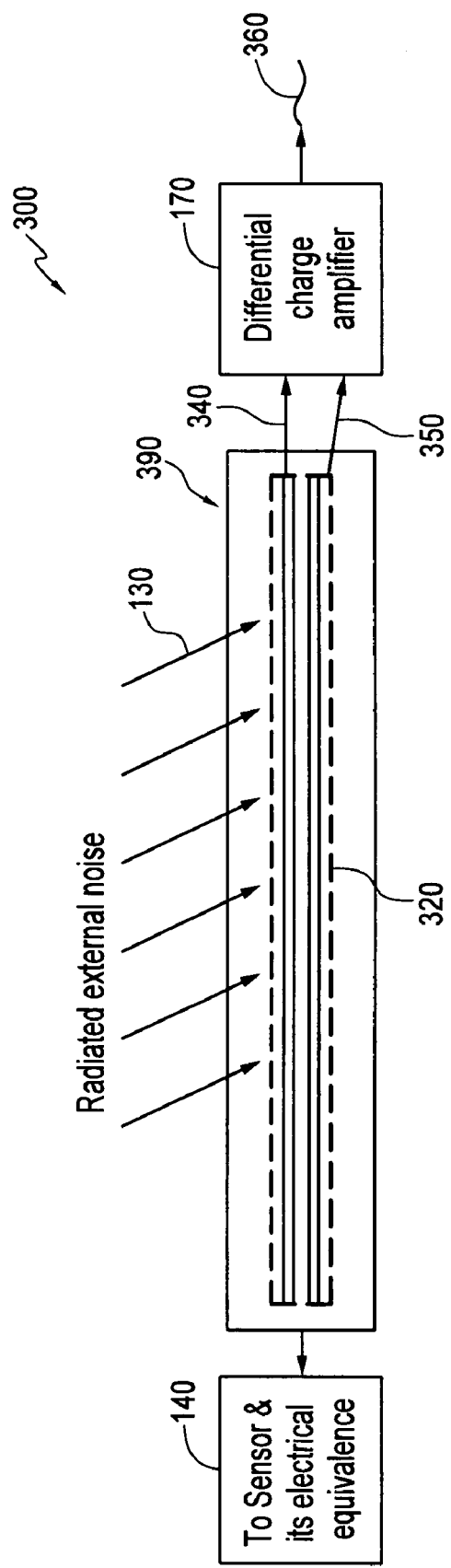
FIG. 3 illustrates a block diagram representation of a prior art untwisted/twisted pair of cable with grounded shield utilized for connecting the sensor element and its equivalent electrical circuit to the differential charge amplifier.
Figure 4:
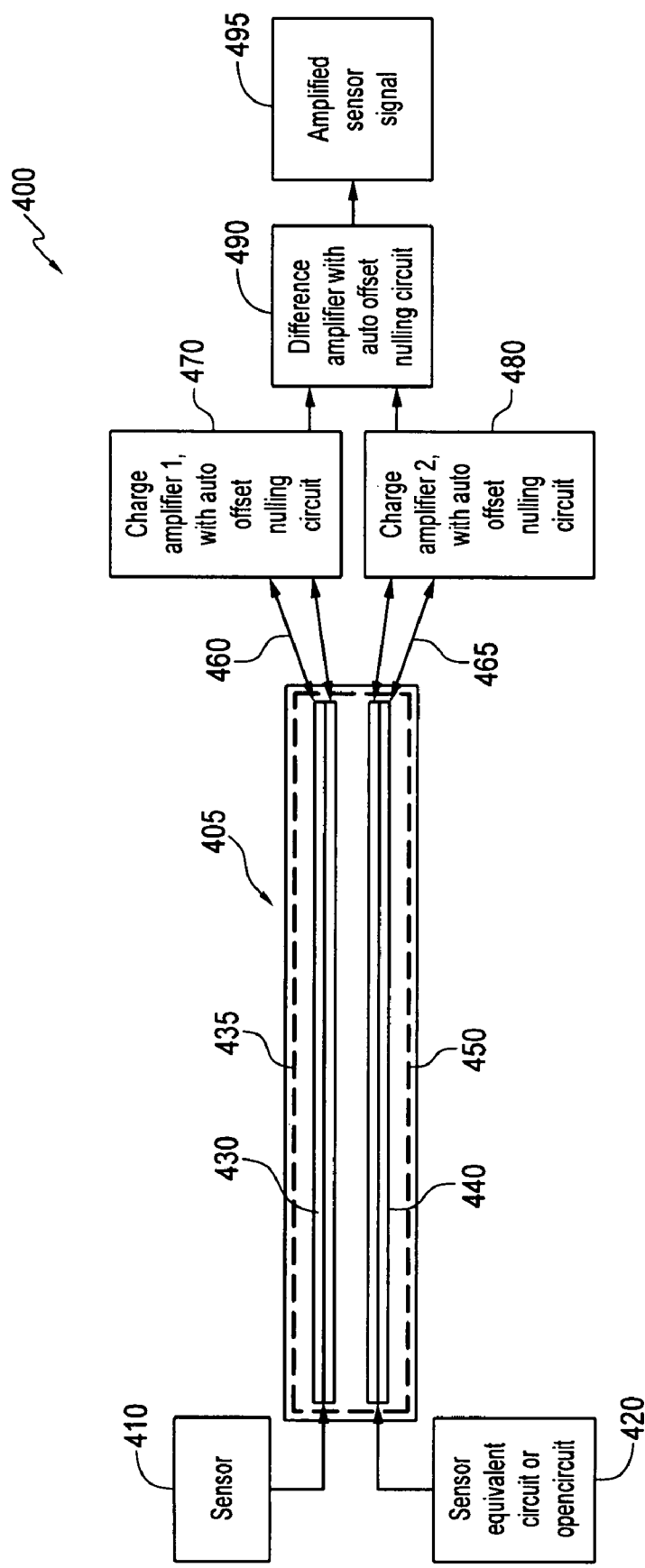
FIG. 4 illustrates a block diagram representation of a low noise differential amplifier circuit with an untwisted/twisted two pair grounded shielded cable, which can be utilized in accordance with a preferred embodiment.

Referring to FIG. 4 a block diagram representation of a low noise differential amplifier circuit 400 with an untwisted and or twisted two pair grounded shielded cable is illustrated, which can be utilized in accordance with a preferred embodiment. The shielded two pair cable 405 includes a core 435 and a shielding 450, which is generally connected to a "ground". The core 435 generally includes two pairs of untwisted and or twisted cable 430 and 440. It can be appreciated, however, that in accordance with other embodiments, the first twisted and or untwisted wire pair 430 and the second twisted and or untwisted wire pair 440 can also be twisted about each other for at least one portion of their mutual length to form these connections. The shielding 450 provides a conductive enclosure for the cable core 435 to insulate it from electromagnetic fields originating outside the shielding 450. Preferably, the shielding 450 closely conform to the core 435 to better maintain the electrical parameters of the cable 405, which might otherwise be altered during flexing of the cable 405.

Figure 5:
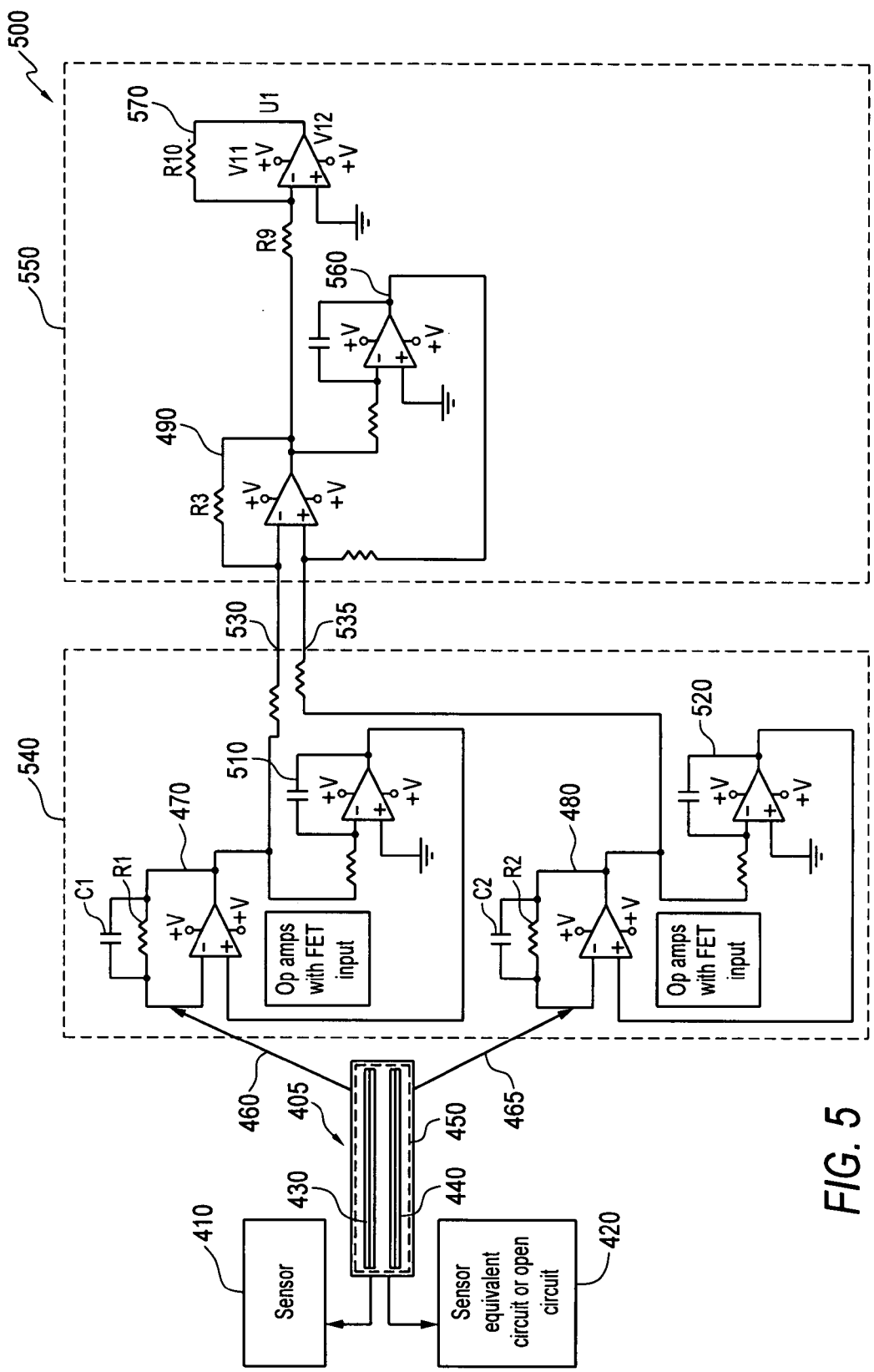
FIG. 5 illustrates a schematic representation of a low noise differential amplifier circuit with an untwisted/twisted two pair grounded shielded cable, in accordance with a preferred embodiment.

The output from the sensor 410 can be coupled to a first wire pair 430 and the second wire pair 440 can be coupled to a sensor electrical equivalent impedance circuit 420. The output 460 from the first twisted and or untwisted wire pair 430 and the output 465 from the second twisted and or untwisted wire pair 440 can be connected to a first charge amplifier 470 and a second charge amplifier 480 respectively. The charge amplifiers 470 and 480 include an auto offset correction circuit 510 and 520 as shown in FIG. 5 in order to reduce error due to offsets, and the output is connected to a differential amplifier 490. The differential amplifier 490 subtracts the signals from the charge amplifiers 470 and 480 hence common mode noise picked up by the cable 405 gets reduced drastically. The first charge amplifier 470 amplifies the sensor signal from the sensor 410 and noise signal picked up by the first wire pair 430 and the second charge amplifier 480 amplifies the noise signal picked up by the second wire pair 440. The differential amplifier 490 subtracts the signals from the charge amplifiers 470 and 480 and output from the differential amplifier 490 can be an amplified sensor signal 495.

The common mode external noise signal picked up by the cable 405 which is having same magnitude and same phase can get subtracted at the differential amplifier stage 490. The differential amplifier 490 has several advantages over a single-ended circuit. It provides a 6 dB increase in signal-to-noise ratio (SNR) due to the gain of 2 in the differential circuit. The balanced structure provides increased common-mode rejection, which attenuates common-mode noise and further increases SNR. DC offset is also greatly attenuated because the circuit has a large common-mode rejection at DC.

Referring to FIG. 5 a schematic representation of a low noise differential amplifier circuit 500 with the untwisted two pair cable with grounded shield is illustrated, in accordance with a preferred embodiment. Note that in FIGS. 4-6, identical or similar parts or elements are generally indicated by identical reference numerals. The differential amplifier 490 includes a pair of input charge amplifiers 470 and 480 for receiving output signals 460 and 465 to be amplified from the wire pairs 430 and 440. A linear offset correction circuit 510, 520 and 560 can be provided with the charge amplifiers 470 and 480 and differential amplifier 490, which includes sources for correcting offset errors in the output signal 570 of the differential amplifier 490.

The offset correction circuits 510, 520 and 560 can be utilized to remove a fixed offset or a slowly varying offset. Normally, circuits not only take offset voltages from input signal waveforms but also have internal offsets, which create offset voltages at their outputs. The offset of the differential amplifier 490 can be removed by utilizing the offset correction circuits 510 and 520 prior to the differential amplifier 490 to keep it from saturating as a result of input offset voltage, and another offset correction loop 560 after the differential amplifier 490 to remove any offset voltage produced by the differential amplifier 490.

The output 460 and 465 from the wire pairs 430 and 440 can be applied to the first stage 540 of the low noise differential amplifier circuit 500, which comprises of charge amplifiers 470 and 480. The charge amplifiers 470 and 480 include feedback resistors R1, R2 and feedback capacitors C1, C2 connected between the outputs and the inverting inputs of the operational amplifiers in 470 and 480. The charge amplifier 470 and 480 can be an operational amplifier, having FET or JFET high input impedance and low bias current circuit configuration at the input stage with a power source of +12V (or any other suitable voltage like +5V, +10V, +15V, based on the supply source like battery or mains) is connected to a positive power source input terminal of the operational amplifier whereas a power source of −12V (or any other suitable voltage like +5V, +10 V, +15V, based on the supply source like battery or mains) is connected to a negative power source input terminal of the operational amplifier as illustrated in FIG. 5. Further the charge amplifier 470 and 480 can be with an operational amplifier working on single supply from rail to rail with a single power source of only +12 V (or any other suitable voltage like +5V, +10 V, +15V, based on the supply source like battery or mains) is connected to a positive power source input terminal of the operational amplifier and the negative terminal of the operational amplifier is connected ground as illustrated in FIG. 5.

The outputs 530 and 535 of charge amplifiers 470 and 480 are connected to the inverting and non-inverting inputs of the differential amplifier 490 in the second stage 550. The differential amplifier 490 produces an output signal which corresponds to the difference in the outputs 530 and 535 of the two charge amplifiers 470 and 480. The grounding of the shield 450 usually improves circuit operation. Metallic shields placed around equipment effectively prevent noise from either entering or leaving the system. The shield minimize capacitive coupling and the common mode noise picked up by the cable 405 can get reduced drastically.

Figure 6:
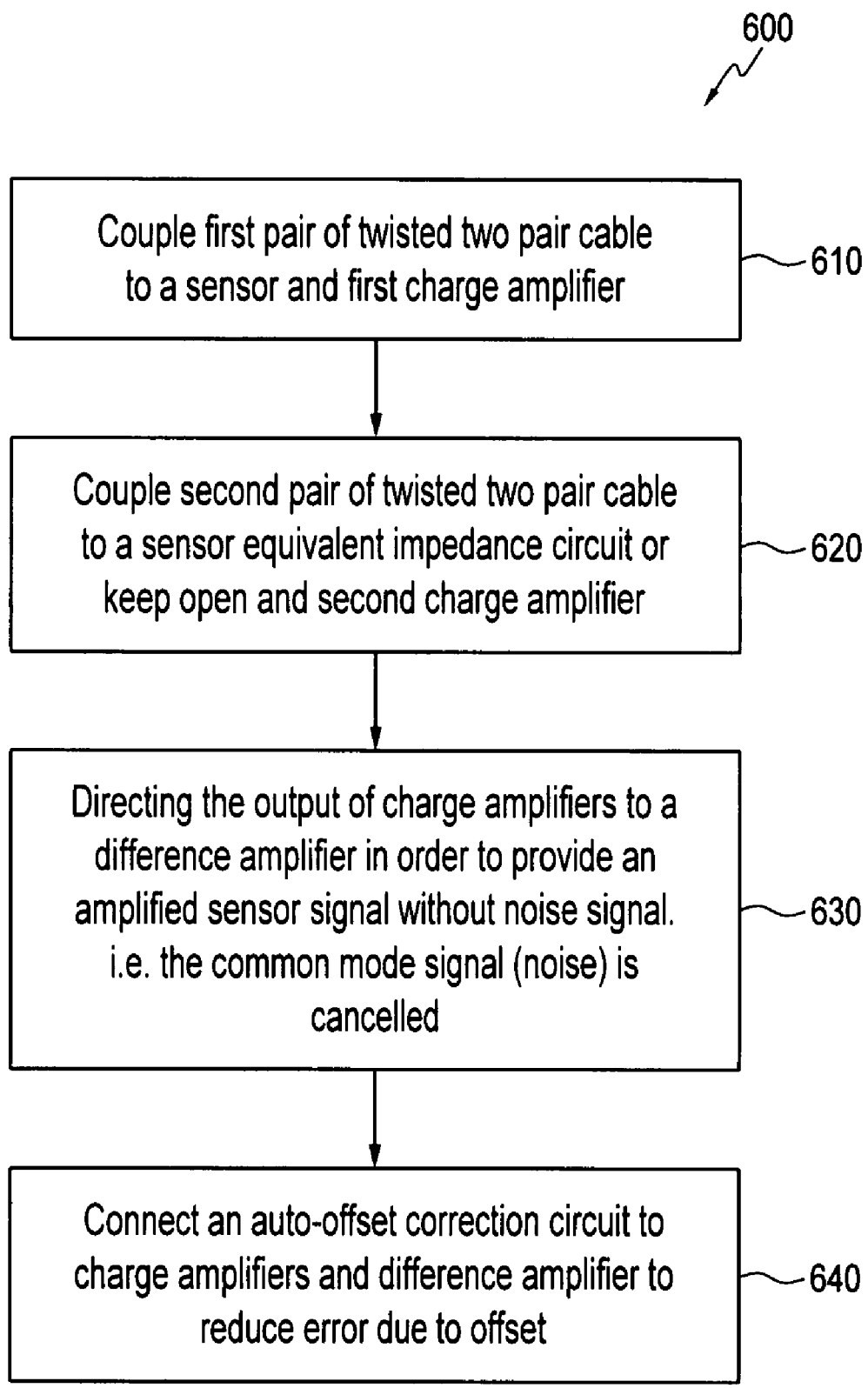
FIG. 6 illustrates a detailed flow chart of operations illustrating logical operational steps of a method for measuring discrete (e.g., pico coulomb) charges in noisy environments utilizing a low noise differential charge or voltage or current amplifier, in accordance with an alternative embodiment.

Referring to FIG. 6 a detailed flow chart of operations illustrating logical operational steps of a method 600 for measuring pico coulomb charge in noisy environment utilizing low noise differential amplifier is illustrated, in accordance with an alternative embodiment. As indicated at block 610, a first pair 430 of twisted and or untwisted two pair cable 405 can be connected to a sensor 410 and first charge amplifier 470, which amplifies the sensor signal and the noise signal. Next, as depicted at block 620, a second pair 440 of twisted and or untwisted two pair cable 405 can be connected to a sensor equivalent impedance circuit or kept open 420 and second charge amplifier 480, which amplifies the noise signal. The output of charge amplifiers 470 and 480 can be directed to the differential amplifier 490 in order to provide an amplified sensor signal 495 without noise signal, as shown at block 630.

An auto-offset correction circuit 510, 520 and 560 can be connected to charge amplifiers 470 and 480 and differential amplifier 490 in order to reduce error due to offset, as described at block 640. The low noise differential amplifier circuit 500 with the untwisted and or twisted two pair cable 405 and grounded shield 450 disclosed herein can therefore reduce common mode noise signal picked up by the cable 405. The noise reduction technique is suitable for ultra low charge, current and voltage measurement in noisy, elevated temperature and corrosive environment utilizing high gain charge, current and voltage amplifier respectively It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method comprising:
   coupling a first wire pair of a twisted two pair cable to a sensor and a first charge amplifier for amplifying a sensor signal associated with the sensor and a noise signal picked up by said first wire pair;
   coupling a second wire pair of said twisted two pair cable to a second charge amplifier for amplifying said noise signal picked up by said second wire pair; and
   directing an output of said first charge amplifier and said second charge amplifier to a differential amplifier having an auto offset correction circuit in order to provide an amplified signal of said sensor without said noise signal.

2. The method of claim 1 further comprising;
   covering said first wire pair and said second wire pair with a conductive shield cover and grounding said conductive shield cover in order to increase noise immunity.

3. The method of claim 1 wherein said first charge amplifier and said second charge amplifier comprises said auto offset correction circuit which substantially reduces error due to offsets.

4. The method of claim 1 wherein said noise signal picked up by said first wire pair and said second wire pair possesses a same amplitude and a phase for subtraction by said differential amplifier in order to provide said amplified signal of said sensor.

5. The method of claim 1 wherein said twisted two pair cable reduces a common mode noise signal when utilized in association with said differential amplifier.

6. The method of claim 1 wherein an output of first charge amplifier is connected to an inverting input of said differential amplifier.

7. The method of claim 1 wherein an output of said second charge amplifier is connected to a non-inverting input of said differential amplifier.

8. The method of claim 1, further comprising coupling the second wire pair of said twisted two pair cable to a circuit having an impedance equivalent to that of the sensor.

9. A system for measuring discrete charges in a noisy environment, comprising:

a first wire pair of a twisted two pair cable coupled to a sensor and a first charge amplifier for amplifying a sensor signal associated with the sensor and a noise signal picked up by said first wire pair;

a second wire pair of said twisted two pair cable coupled to a second charge amplifier for amplifying said noise signal picked up by said second wire pair; and a differential amplifier having an auto offset correction circuit, wherein an output of said first charge amplifier and said second charge amplifier are directed to said differential amplifier in order to provide an amplified signal of said sensor without said noise signal.

10. The system of claim 9 wherein said first wire pair and said second wire pair are covered with a conductive shield cover and are grounded with said conductive shield cover in order to increase noise immunity.

11. The system of claim 9 wherein said first charge amplifier and said second charge amplifier comprises said auto offset correction circuit which substantially reduces error due to offsets.

12. The system of claim 9 wherein said noise signal picked up by said first wire pair and said second wire pair possesses a same amplitude and a phase for subtraction by said differential amplifier in order to provide said amplified signal of said sensor.

13. The system of claim 9 wherein said twisted two pair cable reduces a common mode noise signal when utilized in association with said differential amplifier.

14. The system of claim 9 wherein an output of first charge amplifier is connected to an inverting input of said differential amplifier.

15. The system of claim 9 wherein an output of said second charge amplifier is connected to a non-inverting input of said differential amplifier.

16. The system of claim 9, wherein the second wire pair of said twisted two pair cable is coupled to a circuit having an impedance equivalent to that of the sensor.

17. A system for measuring discrete charges in a noisy environment, comprising:

a first wire pair of a twisted two pair cable coupled to a sensor and a first charge amplifier for amplifying a sensor signal associated with the sensor and a noise signal picked up by said first wire pair;

a second wire pair of said twisted two pair cable coupled to a second charge amplifier for amplifying said noise signal picked up by said second wire pair;

a differential amplifier having an auto offset correction circuit, wherein an output of said first charge amplifier and said second charge amplifier are directed to said differential amplifier in order to provide an amplified signal of said sensor without said noise signal; and a conductive shield cover that covers said first wire pair and said second wire pair, such that said first wire pair and said second wire pair are shielded and grounded with said conductive shield cover in order to increase noise immunity.

18. The system of claim 17 wherein said first charge amplifier and said second charge amplifier comprises said auto offset correction circuit which substantially reduces error due to offsets.

19. The system of claim 17 wherein said noise signal picked up by said first wire pair and said second wire pair possesses a same amplitude and a phase for subtraction by said differential amplifier in order to provide said amplified signal of said sensor.

20. The system of claim 17 wherein said twisted two pair cable reduces a common mode noise signal when utilized in association with said differential amplifier.

21. The system of claim 17 wherein an output of first charge amplifier is connected to an inverting input of said differential amplifier.

22. The system of claim 17 wherein an output of said second charge amplifier is connected to a non-inverting input of said differential amplifier.

23. The system of claim 17, wherein the second wire pair of said twisted two pair cable is coupled to a circuit having an impedance equivalent to that of the sensor.

* * * * *